United States Patent
Sun

(10) Patent No.: US 9,236,375 B2
(45) Date of Patent: Jan. 12, 2016

(54) LOAD SWITCH WITH TRUE REVERSE CURRENT BLOCKING

(75) Inventor: Ni Sun, Sunnyvale, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 354 days.

(21) Appl. No.: 13/483,291

(22) Filed: May 30, 2012

(65) Prior Publication Data

US 2013/0063844 A1    Mar. 14, 2013

Related U.S. Application Data

(60) Provisional application No. 61/534,644, filed on Sep. 14, 2011.

(51) Int. Cl.
| | | |
|---|---|---|
| H01L 27/02 | (2006.01) | |
| H02H 9/04 | (2006.01) | |
| H03K 17/30 | (2006.01) | |
| H02H 3/18 | (2006.01) | |

(52) U.S. Cl.
CPC .............. *H01L 27/0285* (2013.01); *H02H 3/18* (2013.01); *H02H 9/04* (2013.01); *H03K 17/302* (2013.01); *H03K 2017/307* (2013.01)

(58) Field of Classification Search
CPC ........ H02H 9/04; H02H 3/18; H01L 27/0285; H03K 17/302
USPC ..................................................... 361/82, 84
See application file for complete search history.

(56) References Cited

U.S. PATENT DOCUMENTS

| | | | | |
|---|---|---|---|---|
| 5,398,182 A | * | 3/1995 | Crosby | .......................... 363/89 |
| 5,485,073 A | | 1/1996 | Kasashima et al. | |
| 5,539,610 A | * | 7/1996 | Williams et al. | .............. 361/246 |
| 5,594,381 A | * | 1/1997 | Bingham | ...................... 327/534 |
| 5,726,505 A | * | 3/1998 | Yamada et al. | ................ 307/127 |
| 6,021,332 A | | 2/2000 | Alberth, Jr. et al. | |
| 6,351,175 B1 | * | 2/2002 | Rapp | ............................. 327/415 |

(Continued)

FOREIGN PATENT DOCUMENTS

| | | |
|---|---|---|
| CN | 101378558 A | 3/2009 |
| CN | 101557122 | 10/2009 |

(Continued)

OTHER PUBLICATIONS

Texas Instruments—TPS2114A/TPS2115A, Autoswitching Power Mux, Mar. 2004, Revised May 2012, 28 pages.

(Continued)

*Primary Examiner* — Zeev V Kitov
(74) *Attorney, Agent, or Firm* — Grossman Tucker Perreault & Pfleger PLLC

(57) ABSTRACT

Devices, systems and methods are provided for switching a load with true reverse current blocking (TRCB). The device may include an input port coupled to a supply voltage; an output port coupled to the load; a TRCB circuit coupled to the input port and the output port; and a switch control port coupled to the TRCB circuit. The TRCB circuit may be configured to couple the input port to the output port in response to a switch close signal applied to the switch control port and to de-couple the input port from the output port in response to a switch open signal applied to the switch control port. The TRCB circuit may further be configured to block current flow from the output port to the input port in response to both the switch open signal and the switch close signal.

18 Claims, 5 Drawing Sheets

(56) References Cited

U.S. PATENT DOCUMENTS

| | | |
|---|---|---|
| 6,452,362 B1 | 9/2002 | Choo |
| 6,541,947 B1 | 4/2003 | Dittmer et al. |
| 7,414,330 B2 | 8/2008 | Chen |
| 7,451,414 B2 * | 11/2008 | Groos .................... 716/136 |
| 7,554,285 B2 * | 6/2009 | Simoes et al. ............. 320/103 |
| 8,203,234 B2 * | 6/2012 | Lee et al. ................. 307/51 |
| 8,428,513 B2 | 4/2013 | Sklovsky et al. |
| 8,619,400 B2 * | 12/2013 | Dobkin et al. ............. 361/91.1 |
| 8,941,264 B2 | 1/2015 | Scruggs et al. |
| 2004/0155627 A1 | 8/2004 | Stanesti et al. |
| 2005/0037241 A1 | 2/2005 | Schneider et al. |
| 2005/0184715 A1 | 8/2005 | Kidokoro et al. |
| 2005/0285676 A1 | 12/2005 | Jones |
| 2010/0130263 A1 | 5/2010 | Zhang et al. |
| 2010/0231047 A1 | 9/2010 | Lee et al. |
| 2012/0106021 A1 * | 5/2012 | Suchoff .................... 361/194 |

FOREIGN PATENT DOCUMENTS

| | | |
|---|---|---|
| JP | 2004-280704 | 10/2004 |
| JP | 2008-029160 | 2/2008 |

OTHER PUBLICATIONS

Analogic Tech—AAT4674, Power Supply Selector Switch, Sep. 2007, 13 pages.

ON Semiconductor—CAT6500, 3.0 A Power Selector Switch, Aug. 2011, Rev. 1, 13 pages.

Fairchild Semiconductor—FPF1320 / FPF1321, IntelliMAX(TM) Dual-Input Single-Output Advanced Power Switch with True Reverse-Current Blocking, Jan. 2012, Rev. 1.0.0, 16 pages.

International Search Report and Written Opinion dated Aug. 16, 2012 issued in PCT Patent Application No. PCT/CN2011/082758, 12 pages.

Fairchild Semiconductor—FPF3040, IntelliMAX(TM) 20 V-Rated Dual Input Single Output Power-Source-Selector Switch, Sep. 2012, Rev. 2.4.0, 12, pages.

Paul Horowitz et al., The Art of Electronics, 1989, Cambridge University Press, Second Edition, pp. 230-232.

* cited by examiner

LOAD SWITCH WITH TRUE REVERSE CURRENT BLOCKING

CROSS REFERENCE TO RELATED APPLICATIONS

This application claims the benefit of U.S. provisional patent application Ser. No. 61/534,644 filed Sep. 14, 2011, which is incorporated fully herein by reference.

FIELD

The present disclosure relates to a load switch, and more particularly, to a load switch with true reverse current blocking, increased current capability and reduced on-state resistance.

BACKGROUND

Load switches typically link a power supply with a device to be powered (a load) and provide switching control to couple or de-couple the load from the supply based on a switching signal. Examples loads that may be controlled by a load switch include portable devices such as phones, digital cameras, media players, Global Positioning System (GPS) receivers and portable games. Load switches may provide limited or no protection, however, against reverse current flow from the load back to the power supply, which can damage sensitive and/or valuable components. This lack of reverse current flow protection is particularly common when the switch is in an off or open state.

SUMMARY

Generally, this disclosure provides a load switch with true reverse current blocking (TRCB), increased current capability and reduced on-state resistance resulting in reduced energy drain which may be particularly beneficial in battery driven and hot-swap applications. Load switches connect and disconnect systems and loads from DC power and provide protection in the form of reverse current blocking which prevents current from flowing back from the load $V_{OUT}$ to the input of the switch $V_{IN}$ regardless of the state of the switch being open or closed (i.e., on or off). This type of reverse current blocking, which provides protection whether the switch is on or off, is also referred to as TRCB.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure provides a load switch with true reverse current blocking (TRCB), increased current capability and reduced on-state resistance resulting in reduced energy drain which may be particularly beneficial in battery driven and hot-swap applications. Load switches connect and disconnect systems and loads from DC power and provide protection in the form of reverse current blocking which prevents current from flowing back from the load $V_{OUT}$ to the input of the switch $V_{IN}$ regardless of the state of the switch being open or closed (i.e., on or off). This type of reverse current blocking, which provides protection whether the switch is on or off, is also referred to as TRCB.

Figure 1:
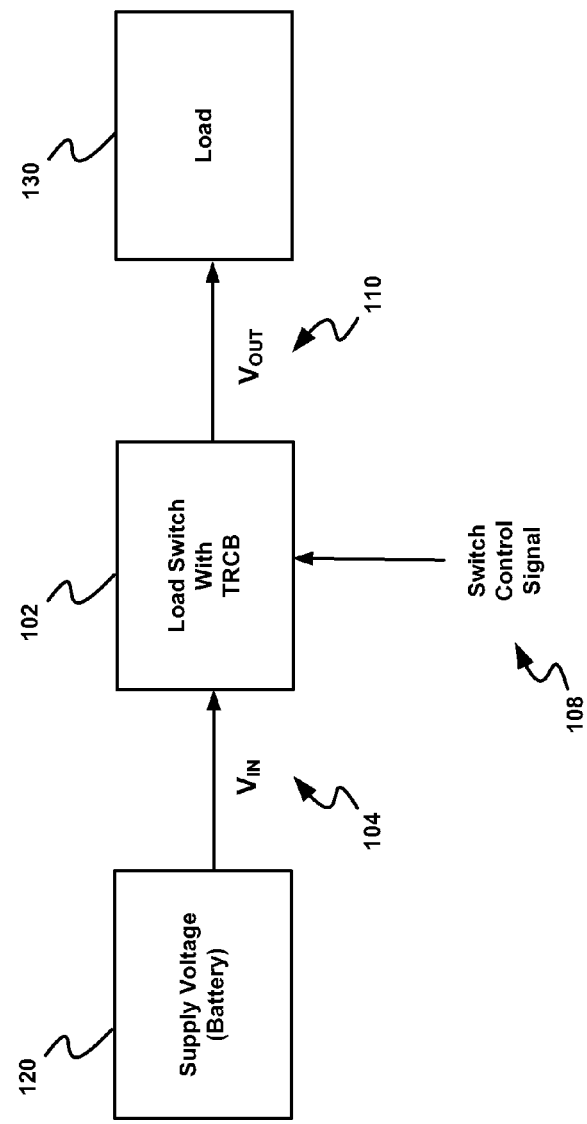
FIG. 1 illustrates a top level block diagram consistent with various embodiments of the present disclosure.

FIG. 1 illustrates a top level system diagram 100 of one exemplary embodiment consistent with the present disclosure. Shown is a load switch 102 that provides TRCB capability as will be described in greater detail below. The load switch 102 is coupled to a supply voltage source 120, which, in some embodiments, may be a battery, providing an input voltage $V_{IN}$ 104 to an input port or pin on the load switch 102. The load switch is also coupled to a load 130 to which power may be supplied through an output port or pin providing output voltage $V_{OUT}$ 110. The load switch 102 operates under the control of a switch control signal 108 which may cause the load switch 102 to open or close.

Figure 2:
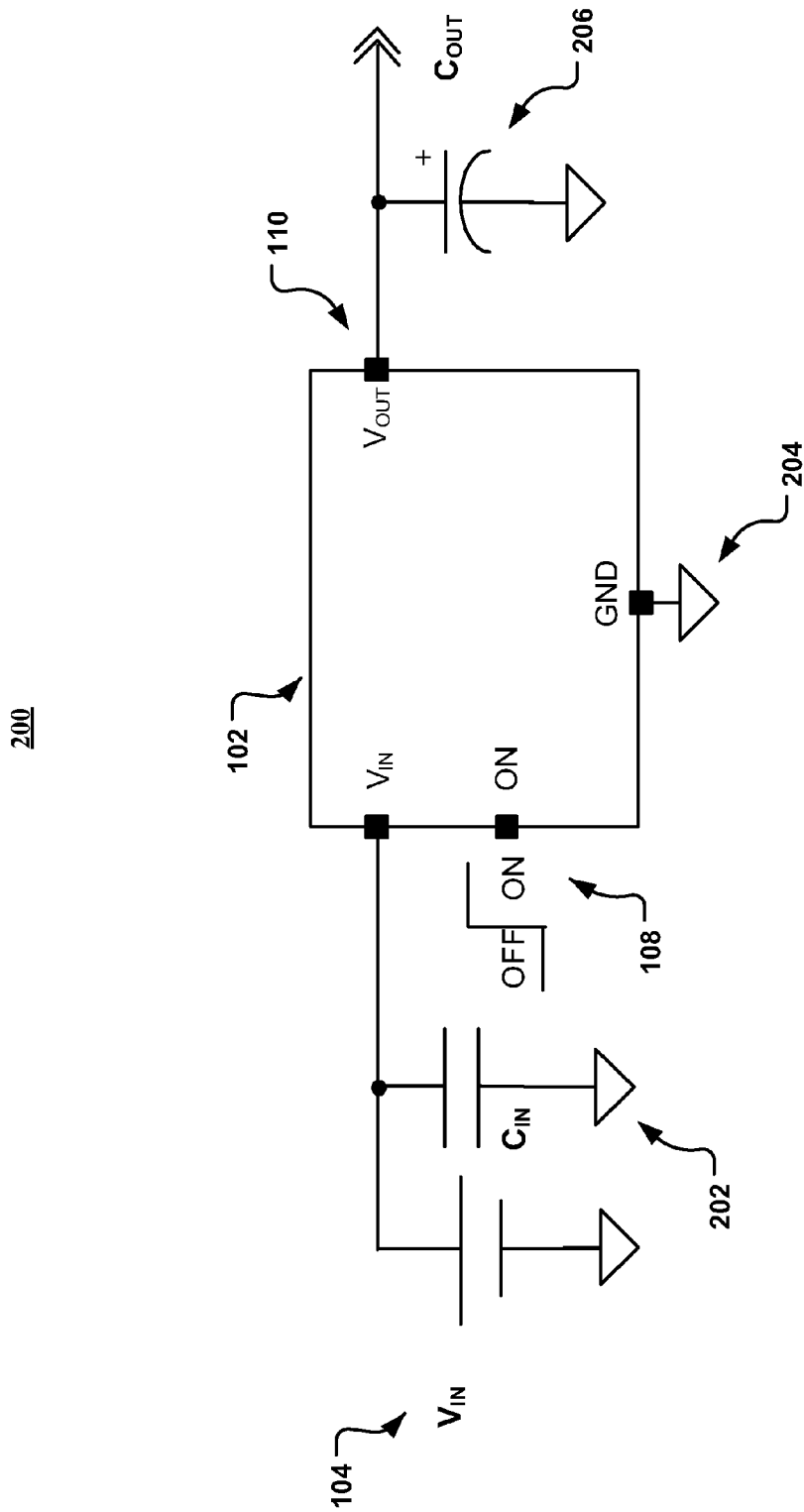
FIG. 2 illustrates a circuit block diagram consistent with various embodiments of the present disclosure.

FIG. 2 illustrates a circuit block diagram 200 consistent with various embodiments of the present disclosure. Circuit block diagram 200 illustrates load switch with TRCB 102 in a circuit application. Load switch 102 switches input voltage $V_{IN}$ 104 to output voltage $V_{OUT}$ 110 under the control of a switch control signal (ON pin) 108. The input circuit has an associated input capacitance $C_{IN}$ 202 and the output load has an associated output load capacitance $C_{OUT}$ 206. Load switch 102 also has a ground connection 204. In some embodiments, input voltage $V_{IN}$ 104 may nominally be in the range of 1.5-5.5 volts DC. Switch control signal 108 may be a low voltage control signal or general purpose input/output (GPIO) signal in conformance with the JESD76 standard for example. Output load capacitance $C_{OUT}$ may range up to a nominal value of 200 uF.

Figure 3:
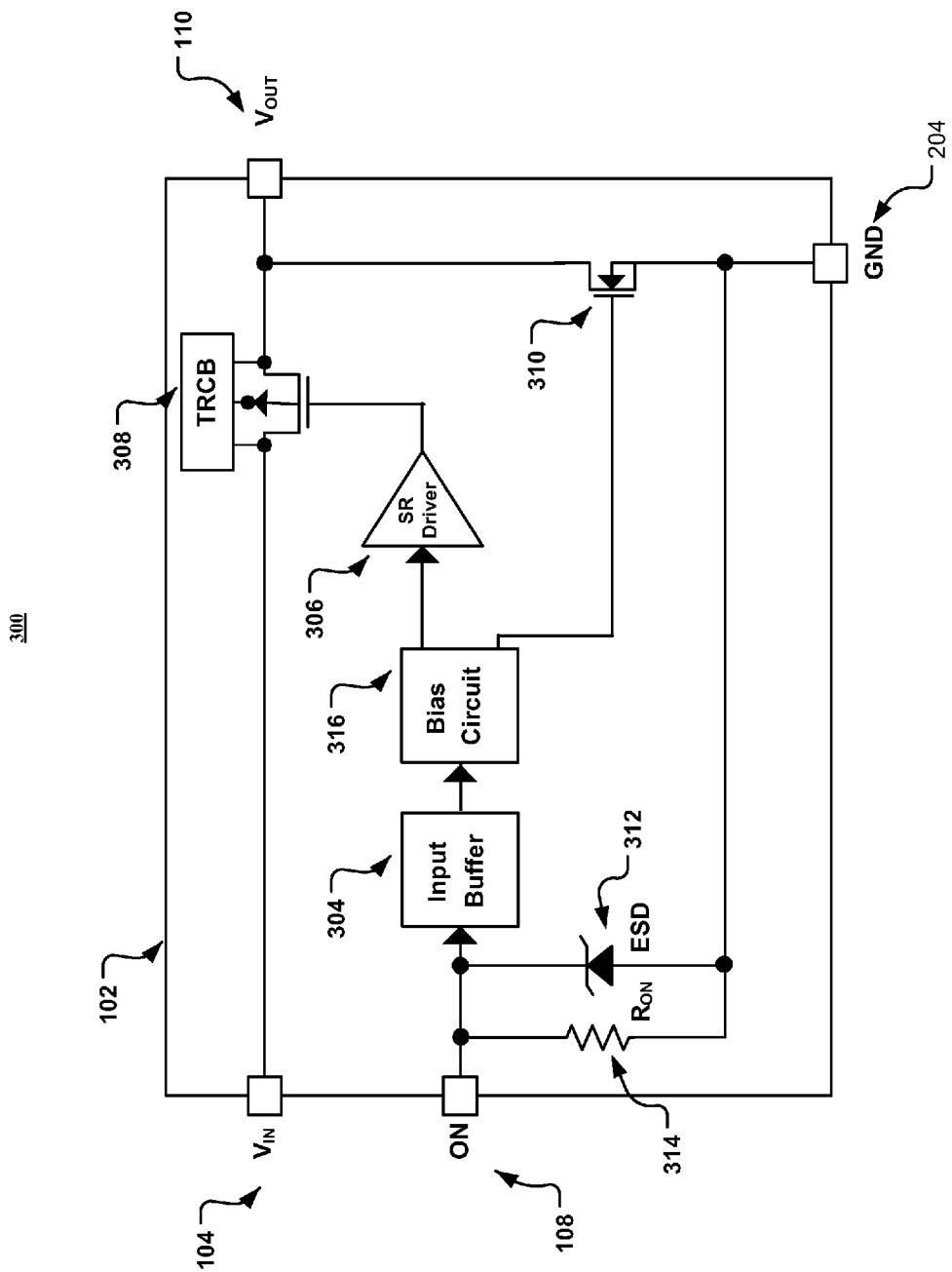
FIG. 3 illustrates a circuit block diagram consistent with various embodiments of the present disclosure.

FIG. 3 illustrates a circuit block diagram 300 consistent with various embodiments of the present disclosure. Circuit block diagram 300 illustrates load switch 102 in greater detail. External connections including input voltage $V_{IN}$ 104, output voltage $V_{OUT}$ 110, switch control signal 108 and ground 204 are all shown. Input voltage $V_{IN}$ 104 is transferred to output voltage $V_{OUT}$ 110 through a low impedance Metal Oxide Semiconductor Field Effect Transistor (MOSFET) switch with TCRB circuit 308. In some embodiments, the impedance of the MOSFET switch may be in the approximate range of 20-75 mΩ, which may be referred to as "ultra low" impedance as a term of art. In some preferred embodiments, the impedance may be less than 25 mΩ. This low MOSFET impedance may provide a reduced on state resistance resulting in increased current flow capability. In some embodiments, TCRB circuit 308 may be configured to disconnect a source voltage supply from a load when $V_{OUT}$ 110 exceeds $V_{IN}$ 104. The TCRB circuit 308 may also include hysteresis logic to prevent false triggers resulting in undesired switching events or reverse current blocking, the false triggers generated from signal noise such as, for example, a spike in the input voltage or power rail bounce.

Input buffer 304 may be configured to interface with low voltage control signals and GPIO signals to receive a switch control signal 108, which may be as low as 1.5 volts in some embodiments.

Resistor $R_{ON}$ 314 eliminates the need for an external pull-down or pull-up resistor at switch control signal 108 and controls the leakage current at the ON pin. Zener diode 312 provides electrostatic discharge (ESD) protection for the load switch 102. Based on the state of switch control signal 108, input buffer block 304 generates a reduced noise signal which is provided to bias circuit block 316 as a reference current and voltage. At substantially the same time, input buffer 304 controls the variation of operating current due to the voltage difference between $V_{IN}$ 104 and switch control signal 108. For the case where $V_{IN}$=5.5V and $V_{ON}$=1.5V, the current consumption can be lower than 1 uA. Slew rate driver block 306 provides a gating signal to the MOSFET in TRCB 308 and regulates the turn-on speed of the MOSFET to reduce the inrush current at the output of the load switch 102 as well as any resulting voltage droop on the input power rails. TRCB block 308 monitors $V_{IN}$ and $V_{OUT}$. If $V_{OUT}$ exceeds $V_{IN}$ by 36 mV or more while $V_{IN}$ is substantially equal to 3.3V, load switch 102 will be turned off and the load will be disconnected from source voltage supply. If TRCB block 308 subsequently detects that $V_{OUT}$ is lower than $V_{IN}$ by 16 mV or more, while $V_{IN}$ is substantially equal to 3.3V, the load will be reconnected to the source voltage supply. In some embodiments, the input buffer block 304 also controls the output discharge switch 310 to discharge output voltage $V_{OUT}$ 110 to ground 204 when the load switch 102 is turned off.

Figure 4:
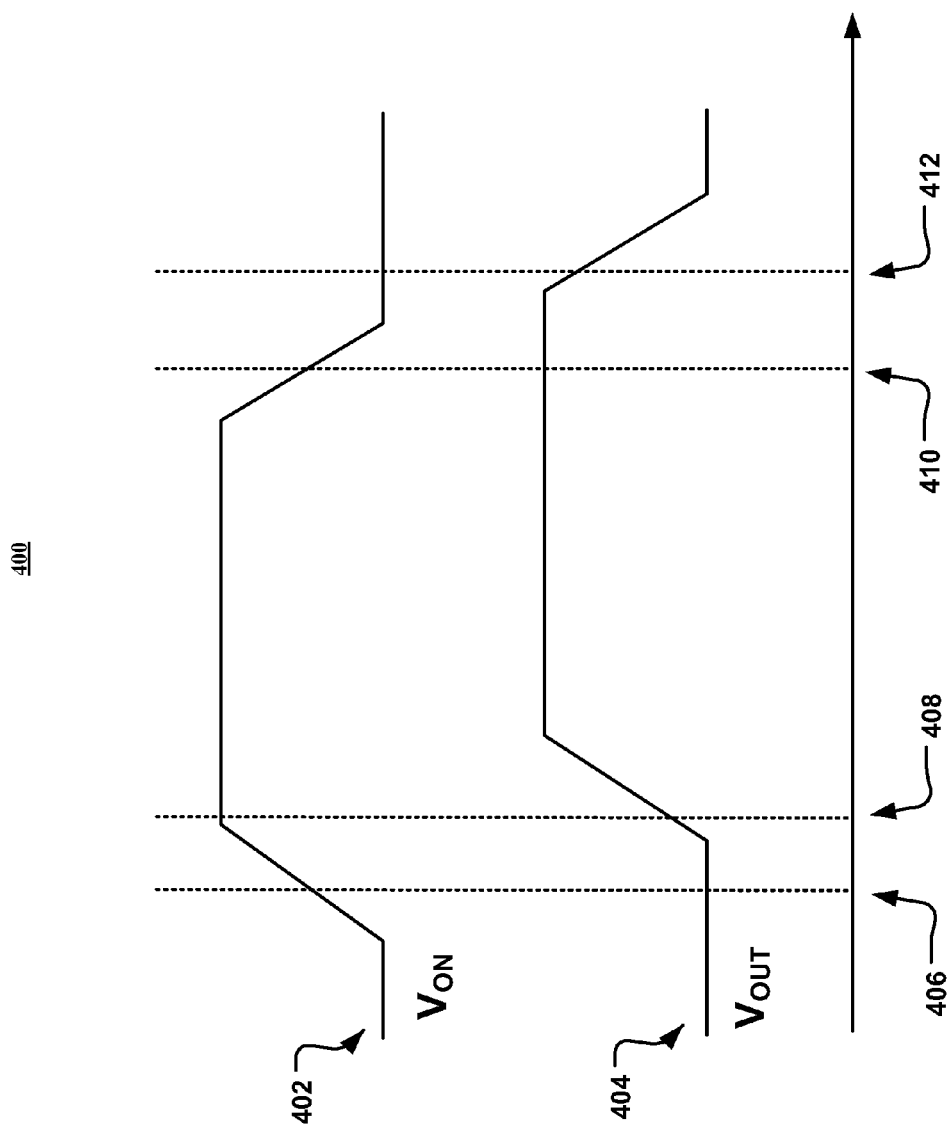
FIG. 4 illustrates a timing diagram consistent with various embodiments of the present disclosure.

FIG. 4 illustrates a timing diagram 400 consistent with various embodiments of the present disclosure. Signal $V_{ON}$ 402 turns on at time 406 to be followed, at later time 408, by $V_{OUT}$ 404 powering on. Similarly, signal $V_{ON}$ 402 turns off at time 410 to be followed, at later time 412, by $V_{OUT}$ 404 powering off. In some embodiments, the turn on and turn off time of signal $V_{ON}$ 402 may be at the midpoint between high voltage signal and low voltage signal.

Figure 5:
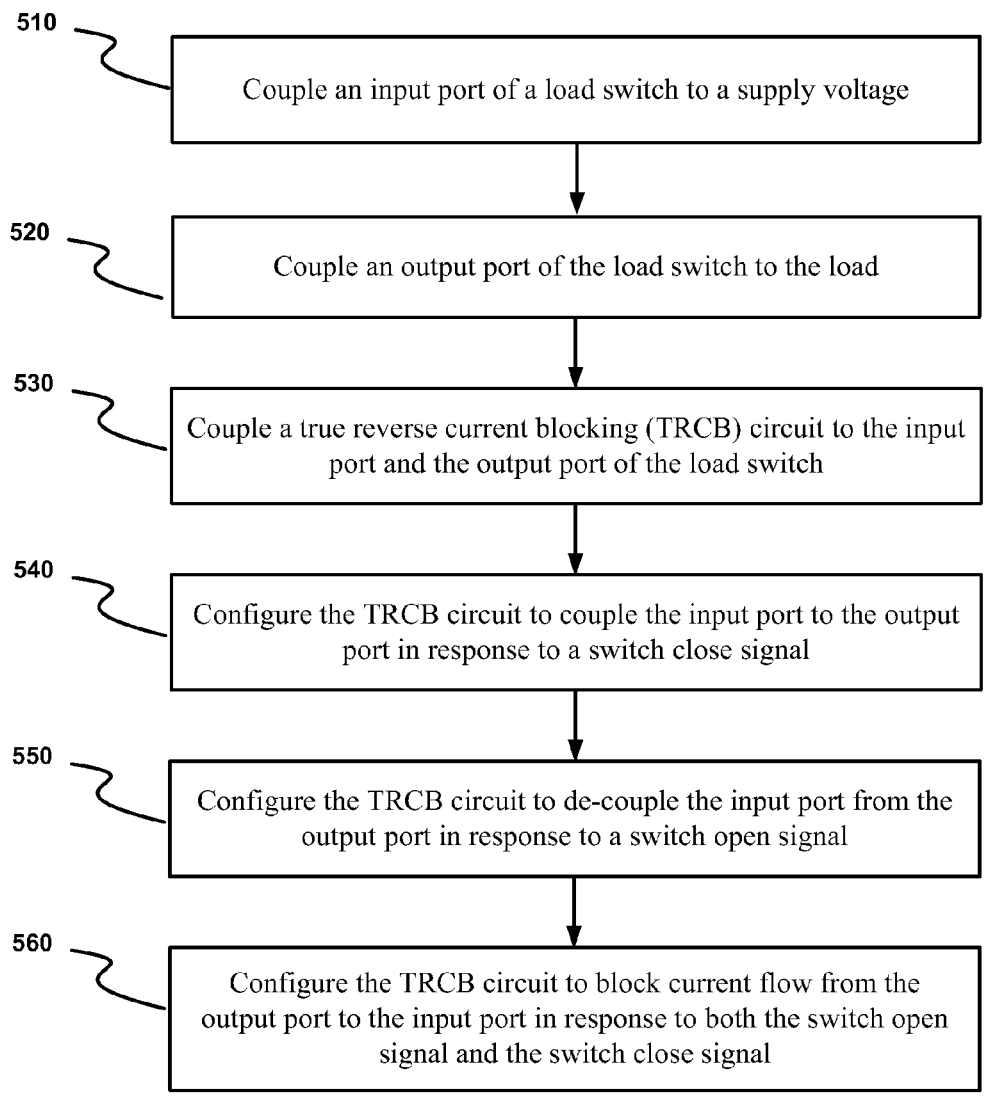
FIG. 5 illustrates a flowchart of operations of another exemplary embodiment consistent with the present disclosure.

FIG. 5 illustrates a flowchart of operations 500 of an exemplary embodiment consistent with the present disclosure. At operation 510, an input port of a load switch is coupled to a supply voltage. At operation 520, an output port of the load switch is coupled to a load. At operation 530, a TRCB circuit is coupled to the input port and the output port of the load switch. At operation 540, the TRCB circuit is configured to couple the input port to the output port in response to a switch close signal. At operation 550, the TRCB circuit is configured to de-couple the input port from the output port in response to a switch open signal. At operation 560, the TRCB circuit is configured to block current flow from the output port to the input port in response to both the switch open signal and the switch close signal.

Thus, the present disclosure provides devices, systems and methods are provided for switching a load with TRCB capability. According to one aspect there is provided a load switch. The load switch may include an input port coupled to a supply voltage. The load switch of this example may also include an output port coupled to the load. The load switch of this example may further include a TRCB circuit coupled to the input port and the output port. The load switch of this example may further include a switch control port coupled to the TRCB circuit, and the TRCB circuit is configured to couple the input port to the output port in response to a switch close signal applied to the switch control port and the TRCB circuit is configured to de-couple the input port from the output port in response to a switch open signal applied to the switch control port, and the TRCB circuit is further configured to block current flow from the output port to the input port in response to both the switch open signal and the switch close signal.

According to another aspect there is provided a method. The method may include coupling an input port of a load switch to a supply voltage. The method of this example may also include coupling an output port of the load switch to the load. The method of this example may further include coupling a TRCB circuit to the input port and the output port. The method of this example may further include configuring the TRCB circuit to couple the input port to the output port in response to a switch close signal. The method of this example may further include configuring the TRCB circuit to de-couple the input port from the output port in response to a switch open signal. The method of this example may further include configuring the TRCB circuit to block current flow from the output port to the input port in response to both the switch open signal and the switch close signal.

According to another aspect there is provided a system. The system may include a supply voltage source. The system of this example may also include a load configured to receive power. The system of this example may further include a load switch configured to selectively couple the supply voltage source to the load based on a switching control signal. The load switch of this example may further include an input port coupled to the supply voltage source. The load switch of this example may further include an output port coupled to the load. The load switch of this example may further include a TRCB circuit coupled to the input port and the output port, and the TRCB circuit is configured to couple the input port to the output port in response to the switching control signal representing a close signal and the TRCB circuit is configured to de-couple the input port from the output port in response to the switching control signal representing a close signal, and the TRCB circuit is further configured to block current flow from the output port to the input port in response to both the open signal and the close signal.

As used herein, use of the term "nominal" or "nominally" when referring to an amount means a designated or theoretical amount that may vary from the actual amount.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EE- PROMs), flash memories, magnetic or optical cards, or any type of media suitable for storing electronic instructions.

The term "switches" may be embodied as MOSFET switches (e.g. individual NMOS and PMOS elements), BJT switches and/or other switching circuits known in the art. In addition, "circuitry" or "circuit", as used in any embodiment herein, may comprise, for example, singly or in any combination, hardwired circuitry, programmable circuitry, state machine circuitry, and/or circuitry that is included in a larger system, for example, elements that may be included in an integrated circuit.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A load switch, comprising:
   an input port coupled to a supply voltage;
   an output port coupled to a load;
   a true reverse current blocking (TRCB) circuit including at least a MOSFET switch coupled to said input port and said output port;
   a slew rate (SR) driver circuit to regulate the turn-on speed of said load switch to reduce inrush current at said output port;
   a switch control port coupled to said TRCB circuit via at least said MOSFET switch and said SR driver circuit, wherein said TRCB circuit is configured to couple said input port to said output port in response to a switch close signal applied to said switch control port and said TRCB circuit is configured to de-couple said input port from said output port in response to a switch open signal applied to said switch control port, and wherein said TRCB circuit is further configured to block current flow from said output port to said input port regardless of said load switch being open or closed;
   an input buffer block configured to:
      receive said switch close and switch open signals from said switch control port;
      control variation in operating current due to a voltage difference occurring between said supply voltage and said switch close and switch open signals; and
      generate a reduced noise signal based on said switch close and switch open signals;
   an output discharge switch coupled to at least said output port and ground; and
   a bias circuit coupled to said input buffer block, said SR driver circuit and said output discharge switch, wherein said bias circuit is configured to:
      receive said reduced noise signal from said input buffer block;
      generate, based on said reduced noise signal, a first switch control signal to control operation of said SR driver circuit and a second switch control signal to control operation of said output discharge switch.

2. The load switch of claim 1, wherein said TRCB circuit is further configured to de-couple said input port from said output port in response to detecting a voltage at said output port that exceeds a voltage at said input port.

3. The load switch of claim 1, further comprising a zener diode coupled between said switch control port and a ground, said zener diode configured to provide electrostatic discharge protection for said load switch.

4. The load switch of claim 1, wherein said MOSFET switch is a reduced impedance MOSFET configured to increase load switch current flow capacity, wherein said reduced impedance is less than 25 mΩ.

5. The load switch of claim 1, wherein said switch close signal is a General Purpose Input/Output (GPIO) signal in the range of 1 to 2 volts.

6. The load switch of claim 1, wherein said TRCB circuit comprises hysteresis logic configured to reduce switching events generated in response to signal noise.

7. The load switch of claim 1, wherein said supply voltage is a battery.

8. A method for controlling a load switch, comprising:
   coupling an input port of a load switch to a supply voltage;
   coupling an output port of said load switch to a load;
   coupling a true reverse current blocking (TRCB) circuit including at least a MOSFET switch to said input port and said output port, wherein said TRCB circuit is configured to block current flow from said output port to said input port regardless of said load switch being open or closed;
   receiving a switch close signal or a switch open signal at an input block from a switch control port;
   controlling, in said input block, variation in operating current due to a voltage difference occurring between said supply voltage and said switch close and switch open signals;
   generating, in said input block, a reduced noise signal based on said switch close signal or switch open signal;
   providing said reduced noise signal from said input block to a bias circuit;
   generating, in said bias circuit based on said reduced noise signal, at least a first switch control signal to control operation of a slew rate (SR) driver circuit and a second switch control signal to control operation of an output discharge switch; and
   configuring said SR driver circuit to cause said TRCB circuit to couple said input port to, or decouple said input port from, said output port based on the first switch control signal, the SR driver circuit regulating the turn-on speed of said load switch to reduce inrush current at said output port.

9. The method of claim 8, further comprising configuring said TRCB circuit to de-couple said input port from said output port in response to detecting a voltage at said output port that exceeds a voltage at said input port.

10. The method of claim 8, further comprising coupling a zener diode between a switch control port of said load switch and a ground, said zener diode configured to provide electrostatic discharge protection for said load switch.

11. The method of claim 8, further comprising configuring said MOSFET switch to be a reduced impedance MOSFET configured to increase load switch current flow capacity, wherein said reduced impedance is less than 25 mΩ.

12. The method of claim 8, wherein said switch close signal is a General Purpose Input/Output (GPIO) signal in the range of 1 to 2 volts.

13. The method of claim 8, further comprising configuring said TRCB circuit to comprise hysteresis logic configured to reduce switching events generated in response to signal noise.

14. A load switching system, comprising:
a supply voltage source;
a load configured to receive power; and
a load switch configured to selectively couple said supply voltage source to said load based on a switching control signal, said load switch comprising:
   an input port coupled to said supply voltage source;
   an output port coupled to said load;
   a slew rate (SR) driver circuit to regulate the turn-on speed of said load switch to reduce inrush current at said output port;
   a true reverse current blocking (TRCB) circuit, including at least a MOSFET switch to receive the switching control signal via the SR driver circuit, coupled to said input port and said output port, wherein said TRCB circuit is configured to couple said input port to said output port in response to said switching control signal representing a close signal and said TRCB circuit is configured to de-couple said input port from said output port in response to said switching control signal representing a close signal, and wherein said TRCB circuit is further configured to block current flow from said output port to said input port regardless of said load switch being open or closed; and
   an input buffer block configured to:
      receive said switch close and switch open signals from said switch control port;
      control variation in operating current due to a voltage difference occurring between said supply voltage and said switch close and switch open signals; and
      generate a reduced noise signal based on said switch close and switch open signals;
   an output discharge switch coupled to at least said output port and ground; and
   a bias circuit coupled to said input buffer block, said SR driver circuit and said output discharge switch, wherein said bias circuit is configured to:
      receive said reduced noise signal from said input buffer block; and
      generate, based at least on said reduced noise signal, a first switch control signal to control operation of said SR driver circuit and a second switch control signal to control operation of said output discharge switch.

15. The load switching system of claim 14, wherein said TRCB circuit is further configured to de-couple said input port from said output port in response to detecting a voltage at said output port that exceeds a voltage at said input port.

16. The load switching system of claim 14, further comprising a zener diode coupled between a port of said load switch and a ground, said zener diode configured to provide electrostatic discharge protection for said load switch.

17. The load switching system of claim 14, wherein said MOSFET switch is a reduced impedance MOSFET configured to increase load switch current flow capacity, wherein said reduced impedance is less than 25 mΩ.

18. The load switching system of claim 14, wherein said TRCB circuit comprises hysteresis logic configured to reduce switching events generated in response to signal noise.

* * * * *